United States Patent [19]

Tsuji et al.

[11] Patent Number: 5,346,957
[45] Date of Patent: Sep. 13, 1994

[54] ADHESIVE COMPOSITION

[75] Inventors: Suguru Tsuji, Tokyo; Hiromi Numata; Shinji Komiyama, both of Kanagawa, all of Japan

[73] Assignee: Nippon Zeon Co., Ltd., Tokyo, Japan

[21] Appl. No.: 109,574

[22] Filed: Aug. 19, 1993

Related U.S. Application Data

[63] Continuation of Ser. No. 888,710, May 27, 1992, abandoned.

[30] Foreign Application Priority Data

May 27, 1991 [JP] Japan .................................. 3-151072
Jun. 18, 1991 [JP] Japan .................................. 3-173154

[51] Int. Cl.$^5$ ......................... C08L 9/02; C08L 63/00
[52] U.S. Cl. ................................... 525/122; 525/113; 525/139; 525/140; 525/141
[58] Field of Search ................. 525/122, 139, 140, 141

[56] References Cited

U.S. PATENT DOCUMENTS

| | | | |
|---|---|---|---|
| 4,160,757 | 7/1979 | Honda et al. | 525/122 |
| 4,298,656 | 11/1981 | Mendelsohn | 525/122 |
| 4,707,518 | 11/1987 | Shah | 525/122 |

FOREIGN PATENT DOCUMENTS

| | | |
|---|---|---|
| 0361975A2 | 4/1990 | European Pat. Off. . |
| 0434013A2 | 6/1991 | European Pat. Off. . |
| 62-59681 | 3/1987 | Japan . |
| 62-246977 | 10/1987 | Japan . |
| 63-86494 | 4/1988 | Japan . |
| 64-60679 | 3/1989 | Japan . |
| 1-249876 | 10/1989 | Japan . |
| 1-292086 | 11/1989 | Japan . |
| 2-58885 | 2/1990 | Japan . |
| 2-91177 | 3/1990 | Japan . |
| 2-133483 | 5/1990 | Japan . |
| 2-167381 | 6/1990 | Japan . |
| 2-279781 | 11/1990 | Japan . |
| 3-64387 | 3/1991 | Japan . |
| 1083558 | 7/1967 | United Kingdom . |
| 1395729 | 5/1975 | United Kingdom . |

*Primary Examiner*—Paul R. Michl
*Assistant Examiner*—Olga Asinovsky
*Attorney, Agent, or Firm*—Lowe, Price, LeBlanc & Becker

[57] ABSTRACT

Disclosed herein is an adhesive composition comprising (A) 100 parts by weight of at least one rubber component selected from the group consisting of unsaturated nitrile-conjugated diene copolymer rubbers prepared by an aqueous suspension polymerization, containing 10–45 wt. % of unsaturated nitrile units in their polymer chains and having a Mooney viscosity ($ML_{1+4}$, 100° C.) of 30–100, and hydrogenated unsaturated nitrile-conjugated diene copolymer rubbers obtained by hydrogenating at least part of carbon-carbon double bonds in each of the unsaturated nitrile-conjugated diene copolymer rubbers, and (B) 50–500 parts by weight of at least one thermosetting resin selected from the group consisting of phenolic resins and epoxy resins.

7 Claims, No Drawings

ADHESIVE COMPOSITION

This application is a continuation of application Ser. No. 07/888,710 filed May 27, 1992, now abandoned.

FIELD OF THE INVENTION

This invention relates to an adhesive composition suitable for an adhesive used in various kinds of electronic parts, and more specifically to an adhesive composition which comprises a rubber component and a resin component, and is excellent in electrical insulating property, adhesive property and heat-resisting adhesive property.

BACKGROUND OF THE INVENTION

In order to join or fix various kinds of electronic parts to each other or other parts, there are used adhesives and/or insulating tapes having an adhesive layer. In the fabrication process of semiconductors, adhesives are used in adhesion of die bonding and potting or of packaging case and heat sink in IC elements or in insulating tapes for fixing lead frames, or the like.

With the recent increase of needs to make electronic parts high-performance, high-reliable, and small in size and light in weight, the adhesion of the electronic parts has come to be required not only to join and/or fix the electronic parts, but also to provide functions such as insulation, proofness to moisture and resistance to heat and reliability. Adhesives used in semiconductor devices also have come to be required to have higher electrical insulating property and adhesive strength as semiconductor elements have been made high in integration degree and/or density. High heat resistance is also required in many cases. In particular, insulating tapes for electronic parts such as insulating tapes for fixing lead frames are required to be good in current-leaking tendency, adhesive strength right after taping, adhesive strength after heat history and the like.

However, conventional adhesives for electronic parts involve a problem of reliability in that they are insufficient in heat resistance upon wire bonding, or corrosion of aluminum wirings and/or reduction in insulating property are caused by trace impurities contained therein.

As rubber-based adhesives for electronic parts, there have heretofore been used adhesives in which an unsaturated nitrile-conjugated diene copolymer rubber excellent in adhesive property to high-polar adherends is contained as a base polymer. Since the unsaturated nitrile-conjugated diene copolymer rubbers are weak in cohesion, a phenolic resin or epoxy resin is incorporated therein to offset their defects, thereby improving their adhesive property, workability, heat resistance, current-leaking tendency, etc. (for example, Japanese Patent Application Laid-Open Nos. 59681/1987, 246977/1987, 86494/1988, 60679/1989, 249876/1989, 292086/1989, 58885/1990, 91177/1990, 133483/1990, 167381/1990, 279781/1990 and 64387/1991, etc.).

Such unsaturated nitrile-conjugated diene copolymer rubbers have been generally prepared by an emulsion polymerization. The copolymer rubbers prepared by the emulsion polymerization however contain a great amount of residual impurities such as an emulsifier and metallic ions because an ionic surfactant is used as the emulsifier and the resulting polymer is solidified by a metallic compound after the polymerization. The use, as a base polymer for adhesives, of the copolymer rubber containing such ionic impurities involves problems of corrosiveness of the adhesives to metals and reduction of their electrical insulating property.

As a method of lowering the concentration of such residual impurities, it has been proposed to dissolve a copolymer rubber in a solvent and then pour the resulting solution into distilled water or the like to reprecipitate the copolymer rubber and dry it, or to purify a copolymer rubber under boiling in a poor solvent such as distilled water (Japanese Patent Application Laid-Open No. 279781/1990). However, such a purification process is very complicated and may be accompanied by a potential problem that the copolymer rubber is adversely modified due to deterioration or the like in the course of the purification process.

On the other hand, solution polymerization and bulk polymerization permit the reduction of the content of impurities such as metallic ions in the resulting copolymer rubber. However, these polymerization processes are generally difficult to provide an unsaturated nitrile-conjugated diene copolymer rubber as a high-molecular weight product. When the low-molecular weight copolymer rubber is used to prepare an adhesive composition, its flexibility-imparting and adhesive strength-holding properties and the like become insufficient.

SUMMARY OF THE INVENTION

An object of this invention is to provide an adhesive composition comprising, as a base polymer, an unsaturated nitrile-conjugated diene copolymer rubber, which is low in content of ionic impurities and has a high molecular weight, and suitable for an adhesive for electronic parts.

Another object of this invention is to provide an adhesive composition which comprises, as a base polymer, an unsaturated nitrile-conjugated diene copolymer rubber, and is excellent in electrical insulating property, adhesive property, heat-resisting adhesive property and the like.

A further object of this invention is to provide an adhesive composition excellent in current-leaking tendency, adhesive strength right after taping and adhesive strength after heat history when using it as an adhesive layer of insulating tapes for electronic parts such as insulating tapes for fixing lead frames.

The present inventors have carried out an extensive investigation with a view toward overcoming the problems involved in the prior art. As a result, it has been found that an unsaturated nitrile-conjugated diene copolymer rubber prepared by an aqueous suspension polymerization and a hydrogenated product thereof are high in purity and molecular weight, and a composition comprising the copolymer rubber and/or the hydrogenated product and a phenolic resin and/or an epoxy resin is excellent in electrical insulating property, adhesive strength and heat resistance. The present invention has been brought to completion on the basis of this finding.

According to the present invention, there is thus provided an adhesive composition comprising (A) 100 parts by weight of at least one rubber component selected from the group consisting of unsaturated nitrile-conjugated diene copolymer rubbers prepared by an aqueous suspension polymerization, containing 10–45 wt. % of unsaturated nitrile units in their polymer chains and having a Mooney viscosity ($ML_{1+4}$, 100° C.) of 30–100, and hydrogenated unsaturated nitrile-conjugated diene copolymer rubbers obtained by hydrogenating at least part of carbon-carbon double bonds in each of the unsaturated nitrile-conjugated diene copolymer rubbers, and (B) 50–500 parts by weight of at least one thermosetting resin selected from the group consisting of phenolic resins and epoxy resins.

DETAILED DESCRIPTION OF THE INVENTION

The present invention will hereinafter be described in details.

Rubber component

The unsaturated nitrile-conjugated diene copolymer rubber useful in the practice of this invention is a polymer prepared by an aqueous suspension polymerization and having the following features:

(a) it contains 10–45 wt. % of unsaturated nitrile units in its polymer chain; and
(b) it has a Mooney viscosity ($ML_{1+4}$, 100° C.) within a range of 30–100.

The unsaturated nitrile-conjugated diene copolymer rubber used in this invention is low in impurity concentration because it has been prepared by the aqueous suspension polymerization. However, the copolymer rubber particularly preferably has the following property values:

(c) the content of organic and inorganic ions is 10 ppm or less; and
(d) the electric conductance of an extractant solution when extracted with deionized water is 30 µS/cm or less.

If the content of the unsaturated nitrile units in the polymer chain is lower than 10 wt. %, the compatibility of the copolymer rubber with the phenolic resin becomes poor, so that the adhesive strength of the adhesive composition is lowered. Any contents exceeding 45 wt. % to the contrary result in an adhesive composition low in rubber elasticity, so that its adhesive strength is lowered and moreover, the flexibility of the adhesive surface when used as an adhesive layer is impaired.

Any Mooney viscosities of the copolymer rubber lower than 30 result in an adhesive composition deteriorated in adhesive strength and are accompanied by a problem in practical use such that when such an adhesive composition is used as an adhesive for insulating tapes, the surface of the adhesive layer becomes sticky and taping workability is hence lowered. Any Mooney viscosities exceeding 100 on the other hand result in an adhesive composition reduced in adhesive strength and impaired in flexibility when used as an adhesive layer.

When the adhesive strength is lowered, leakage values of electric current are caused to vary, so that it is impossible to stably lower the leakage value of electric current. The term "current-leaking tendency" as used herein means a phenomenon in which an electric current flows through an insulating tape for fixing lead frames by way of example when the adhesive composition is used as an adhesive layer of the insulating tape. The reliability of the insulating tape becomes more improved as this value of electric current is smaller.

If the content of the organic and inorganic ions in the copolymer rubber exceeds 10 ppm, or the electric conductance of the extractant solution when extracted with deionized water is greater than 30 µS/cm, it is difficult to achieve the provision of an adhesive composition having high electrical insulating property and corrosion resistance.

The unsaturated nitrile-conjugated diene copolymer rubber is a polymer obtained by copolymerizing at least one of conjugated diene monomers such as 1,3-butadiene, isoprene and 1,3-pentadiene and at least one of nitrile-contained unsaturated monomers (unsaturated nitriles) such as acrylonitrile and methacrylonitrile and optionally, at least one of further monomers copolymerizable with these monomers by an aqueous suspension polymerization.

As illustrative examples of the copolymerizable monomer, may be mentioned vinyl aromatics such as styrene, α-methylstyrene and divinylbenzene; unsaturated carboxylic acids such as acrylic acid, methacrylic acid, itaconic acid, maleic acid, and salts thereof; esters of the above-mentioned unsaturated carboxylic acids such as methyl acrylate, 2-ethylhexyl acrylate and methyl methacrylate; alkoxyalkyl esters of the above-mentioned unsaturated carboxylic acids such as methoxyethyl acrylate and methoxyethoxyethyl acrylate; amide monomers such as acrylamide, methacrylamide, N-methylol(meth)acrylamide, N,N'-dimethylol(meth)acrylamide and N-ethoxymethyl(meth)acrylamide; cyano-substituted alkyl esters of (meth)acrylic acid such as cyanomethyl (meth)acrylate, 2-cyanoethyl (meth)acrylate, and 2-ethyl-6-cyanohexyl (meth)acrylate; epoxy-contained monomers such as allyl glycidyl ether, glycidyl acrylate and glycidyl methacrylate; and the like.

As units derived from the respective monomers, the copolymer rubber preferably contains 55–90 wt. % of conjugated diene units, 10–45 wt. % of unsaturated nitrile units and 0–20 wt. % of units from the monomer copolymerizable therewith. In particular, the units from the unsaturated nitrile must be contained in a range of 10–45 wt. % as described above.

In this invention, the unsaturated nitrile-conjugated diene copolymer rubbers prepared by an aqueous suspension polymerization are used.

The weight ratio of the monomer components to water in the suspension polymerization is generally 1:0.1 to 1:4.

The illustrative examples of dispersants include water-soluble cellulose ethers such as methyl cellulose, hydroxyethyl cellulose, hydroxypropyl cellulose, hydroxypropylmethyl cellulose and carboxymethyl cellulose; partially saponified polyvinyl alcohols; water-soluble polymers such as acrylic acid polymers and gelatin; fatty diesters of polyethylene glycol; starches; tragacanth gum; gum arabic; and the like. These dispersants may be use either singly or in combination.

The amount of the dispersant to be used is within a range of 0.01–5 parts by weight, preferably 0.05–3 parts by weight per 100 parts by weight of the monomer mixture though the optimum amount varies according to the kind thereof. Any amounts less than 0.01 part by weight fail to achieve an effect of a dispersant itself. Any amounts exceeding 5 parts by weight to the contrary result in a reaction mixture too high in viscosity.

As a polymerization initiator, there is used a monofunctional peroxide such as benzoyl peroxide, t-butyl peroxypivalate, diisopropyl peroxydicarbonate or acetyl peroxide; a bifunctional peroxide such as 2,5-dimethyl2,5-di(2-ethylhexanoyl peroxy)hexane, 2,2-dimethyl-2,5-di(t-butyl peroxy)hexane, 2,5-dimethyl-2,5-di(3,5,5-trimethylhexanoyl peroxy)hexane, 2,5-dimethyl-2,5-di(2etylhexanoyl peroxy)hexyne-3,1,6-hexanediol-bis(t-butyl peroxycarbonate), 1,6-hexanediol-bis(t-octyl peroxycarbonate) or 1,6-hexanediol-bis(cumyl peroxycarbonate); an azo compound such as 2,2'-azobisisobutyronitrile; or a mixture thereof. In order to obtain a copolymer rubber having a higher molecular weight, it is preferable to use a bifunctional peroxide among these polymerization initiators.

The amount of the polymerization initiator to be used is generally 0.01–5 parts by weight per 100 parts by weight of the monomer mixture. The polymerization temperature is preferably within a range of 50–130° C. in general though it varies according to the kind of the polymerization initiator used or the polymerization process.

When the unsaturated nitrile-conjugated diene copolymer rubber is prepared by suspension polymerization, it is desirable to control the conversion of polymerization to 50% or lower because gelation occurs as the reaction is advanced.

No particular limitation is imposed on other conditions of the aqueous suspension polymerization, for example, a charging method of the water, monomers, dispersant, polymerization initiator and the like into a polymerization reactor. Further, a molecular weight modifier, chain transfer agent and the like may be added to the polymerization system as needed.

The hydrogenated unsaturated nitrile-conjugated diene copolymer rubber useful in the practice of this invention is a hydrogenated product obtained by hydrogenating at least part of the carbon-carbon double bonds in the unsaturated nitrile-conjugated diene copolymer obtained by the above-described aqueous suspension polymerization. From the viewpoint of heat resistance, the hydrogenation is desirably conducted to such a degree that the iodine value of the partially hydrogenated copolymer rubber is preferably 120 or lower, more preferably 80 or lower. The reaction upon the hydrogenation is conducted by a usual process and no particular limitation is hence imposed on such reaction.

Thermosetting resin

The phenolic resin useful in the practice of this invention may be either a novolak type or a resol type and is formed by the reaction of phenol and/or a substituted phenol with an aldehyde. A preferred aldehyde is formaldehyde.

No particular limitation is imposed on the epoxy resin used in this invention. Various kinds of epoxy resins such as bisphenol A type, cresol novolak type, phenolic novolak type and the like may be used.

These thermosetting resins may be used either singly or in combination.

Adhesive composition

With respect to the proportions of the rubber component and the thermosetting resin in the adhesive composition, it is necessary for the thermosetting resin to fall within a range of 50–500 parts by weight per 100 parts by weight of the rubber component. If the proportion of the thermosetting resin is lower than 50 parts by weight, the tackiness of the surface of an adhesive layer where the adhesive composition is used as an adhesive for an insulating tape is increased, so that its workability, adhesive property, current-leaking tendency and the like are deteriorated, resulting in failure to provide a proper tape. Any proportions of the thermosetting resin exceeding 500 parts by weight result in an insulating tape insufficient in adhesive strength, workability and the like. The proportion of the thermosetting resin is preferably 70–400 parts by weight, more preferably 100–300 parts by weight.

If desired, the adhesive composition according to this invention may contain crosslinking agents (curing agents, vulcanizing agents) for the phenolic resin, the epoxy resin, and the unsaturated nitrile-conjugated diene copolymer rubber and hydrogenated product thereof so as to exhibit self-crosslinkability upon heating.

No particular limitation is imposed on the curing agent for the phenolic resin so long as it is generally being used as a curing agent for phenolic resins. As illustrative examples thereof, may be mentioned paraformaldehyde and hexamethylenetetramine. These curing agents are generally added in a proportion of 0.05–30 parts by weight, preferably 0.1–10 parts by weight per 100 parts by weight of the phenolic resin.

No particular limitation is imposed on the curing agent for the epoxy resin so long as it is generally being used as a curing agent for epoxy resins. As illustrative examples thereof, may be mentioned glyoxal, various kinds of amines, acid anhydrides, isocyanate compounds, polyester amide resins, imidazole compounds and dicyandiamide. The proportion of these curing agents to be used widely varies according to the kind thereof. However, they are generally added in a proportion of 0.05–50 parts by weight, preferably 0.1–40 parts by weight per 100 parts by weight of the epoxy resin.

As illustrative examples of the vulcanizing agent for the rubber component, may be mentioned organic peroxide compounds such as dicumyl peroxide, benzoyl peroxide, 2,5-dimethyl-2,5-di(t-butyl peroxy)hexane, 1,1'-di(t-butyl peroxy)-3,3,5-trimethylenecyclohexane and 1,2-di(t-butyl peroxy)diisopropylbenzene. These vulcanizing agents are generally used in a proportion of 0.05–10 parts by weight, preferably 0.1–2 parts by weight per 100 parts by weight of the rubber component.

In addition, various kinds of fillers may be incorporated if desired.

The respective components consisting of the rubber component, thermosetting resin and optional crosslinking agent are generally dissolved intimately in an organic solvent to use them. Namely, the above components are dissolved in at least one organic solvent such as acetone, methyl ethyl ketone, methyl isobutyl ketone, toluene or xylene to mix them into an adhesive solution (varnish) having a solution viscosity of about 1–100 poises (25° C.) in general.

When the adhesive composition according to this invention is used as an adhesive layer for insulating tapes, there is provided, as a base material, a heat-resistant film formed of polyimide, polyether imide, poly(ether ether ketone) or poly(phenylene sulfide); a composite heat-resistant film made of epoxy resin-glass cloth or epoxy resin-polyimide-glass cloth; or the like. The above-described varnish is coated on at least one side thereof. The thus-coated base material is dried, thereby providing an adhesive layer thereon.

The thickness of the base material may be chosen as necessary for the end application intended, but is generally 10–150 μm. On the other hand, the dry thickness of the adhesive layer is generally 15–50 μm where insulating tapes for electronic parts such as an insulating tape for fixing lead frames are intended to fabricate. If the thickness of the adhesive layer is too thin, adhesive failure tends to occur. To the contrary, if the thickness is too thick, the adhesive composition of the adhesive layer is oozed from the sides of the insulating tape, so that its workability is lowered.

In order to protect the surface of the adhesive layer, a peelable protective layer may be provided thereon. Such protective layers may include polyethylene terephthalate films, polypropylene films, fluororesin films, paper and the like.

ADVANTAGES OF THE INVENTION

The adhesive compositions according to this invention have excellent insulation properties because they comprise, as a base polymer, an unsaturated nitrile-conjugated diene copolymer rubber, which is extremely low in concentration of impurities and has a high molecular weight, and/or a hydrogenated product thereof, and are good in adhesive strength both right after taping and after heat history, workability and the like. They are therefore suitable for adhesives for electronic parts.

The insulating tapes provided with a layer composed of an adhesive composition of this invention can be used in applications such as the support, junction and fixing of various electronic parts, for example, as insulating tapes for fixing lead frames, insulating tapes for switching parts, insulating spacers for electrode terminals, etc.

EMBODIMENTS OF THE INVENTION

The present invention will hereinafter be described more specifically by the following examples and comparative examples. Incidentally, all designations of "part" or "parts" and "%" as will be used in the examples and comparative examples mean part or parts by weight and wt. % unless expressly noted.

The following methods were followed for the measurements of the physical properties of the copolymer rubbers and insulating tapes.

Measuring methods of physical properties of copolymer rubber (1) Measurement of ion content:
1) Ten grams of each copolymer rubber were cut into small pieces 2 mm square and charged together with 100 g of deionized water having an electric conductance of 5 μS/cm or lower into a 200-cc glass-made pressure bottle.
2) The copolymer rubber sample was subjected to extraction for 24 hours in an atmosphere of 121° C. and 2 atm.
3) Ions in the extractant solution were determined by means of an ion chromatograph to calculate the ion content in the copolymer rubber.

Supposing Na, K, Ca, Mg, Cu, Fe, $NH_4$, Cl, $NO_2$, $NO_3$, $HPO_4$ and $SO_4$ were ions contained in the copolymer rubber, the contents of these ions are determined. The ion content was expressed by the total amount of the respective measurements.

(2) Measurement of electric conductance:
The electric conductance of the extractant solution obtained in the above-described measurement (1) was measured.

(3) Mooney viscosity:
Measured in accordance with JIS K-6300.

(4) Units from unsaturated nitrile (contents of nitrile-contained monomer):
Measured in accordance with JIS K-6384 using a Kjeldahl device.

Measuring methods of physical properties of insulating tape
(1) Leakage current:

Using each of insulating tapes obtained in Examples and Comparative Examples, a pressure cooker test (PCT) was conducted under the following conditions to determine the variation of current property.
1) An insulating tape 1 mm wide and 5 mm long is stuck between pins to be measured on a lead frame of a quad flat package (QFP) provided with 100 pins.
2) The lead frame is molded.
3) A voltage of 10 V is applied between the pins to be measured to measure an initial leakage current value.
4) After the sample for measurement is treated for 500 hours by means of a pressure cooker tester (saturated type, 121° C./2 atm), a voltage of 10 V is applied between the pins to be measured to measure a leakage current value (leakage current value after the 500-hour PCT).

(2) Adhesive strength:
Using each of insulating tapes obtained in Examples and Comparative Examples, taping was conducted on a lead frame provided with 42 pins and 42 alloys by pressing the tape for 0.3 second under conditions of a sticking size of 1.5 mm wide and 10 mm long, a temperature of 200° C. and a pressure of 4 kgf/cm². By this taping, the adhesive layer of the insulating tape was caused to stick to the individual pins fixed on the lead frame.

The adhesive strength at room temperature right after the taping and the adhesive strength after heated for 1 hour at 250° C. (adhesive strength after heat history) were measured by measuring the respective peel strengths by means of a universal tensile tester. Namely, an engaging member was interposed between two pins situated at the central part, about which the insulating tape was stuck, to hook the insulating tape. The engaging member was then pulled up in a direction perpendicular to the joint area with the pins to measure the peel strength of the insulating tape.

Example 1

Preparation of copolymer rubber:

A cylindrical reactor having an inner volume of 10 liters and equipped with a stirring machine having a marine type blades was provided, and was then charged with 1980 g of butadiene and 1620 g of acrylonitrile, the total of which accounted for 3600 g (100 parts), and 3600 g (100 parts) of water and 18 g (0.5 part) of a partially saponified polyvinyl alcohol as a dispersant. The contents were stirred to prepare an aqueous suspension.

Next, 18 g (0.5 part) of 2,5-dimethyl-2,5-di(2-ethylhexanoyl peroxy)hexane as a polymerization initiator was added to react the resulting mixture for 30 hours at a reaction temperature of 65° C. The suspension taken out of the reactor was poured into methyl alcohol with hydroquinone and an alkylated phenol dissolved therein to deposit a rubbery polymer. The crumb formed was taken out of the reactor, washed with water and then dried at 50° C. under reduced pressure, thereby obtaining a copolymer sample to be used for evaluation. The physical properties of this copolymer rubber are shown in Table 1.

Preparation of adhesive solution

Using the thus-obtained copolymer rubber (a), an adhesive solution was prepared in accordance with the following composition:

| | |
|---|---|
| Copolymer rubber | 100 parts |
| Phenolic resin(*1) | 200 parts |
| Hexamethylenetetramine(*2) | 1 part |
| Benzoyl peroxide | 0.5 part |
| Methyl ethyl ketone | 500 parts |

(*1)A novolak type phenolic resin.
(*2)Used after it had been dissolved in an equi-amount of water/methanol (30/70) in advance.

The above-prepared adhesive solution was applied onto a polyimide film ("Capton", trade name, product of Du Pont; thickness: 50 μm) to give a dry coat thickness of 25 μm. The thus-coated film was dried for 10 minutes at 120° C. With respect to the insulating tape thus obtained, the leakage current value and adhesive strength were determined.

The results are shown in Table 2.

Examples 2-6

Polymerization was conducted in accordance with the suspension polymerization procedure described in Example 1 except that the monomer compositions were changed to their corresponding compositions as shown in Table 1, thereby obtaining respective copolymer rubbers. The physical properties are shown in Table 1.

Using the thus-obtained copolymer rubbers (b) through (f), respective adhesive solutions and insulating tapes were successively prepared in the same manner as in Example 1 to evaluate them about the same properties as in Example 1. The results are shown in Table 2.

Comparative Examples 1-3

The following three copolymer rubbers were separately used in place of the copolymer rubbers used in the examples.

Comparative Example 1: Commercially-available acrylonitrile-butadiene copolymer rubber (NBR: "Nipol 1031", product of NIPPON ZEON CO., LTD.; emulsion polymer).

Comparative Example 2: Purified Nipol 1031 Nipol 1031 was dissolved in methyl ethyl ketone. The resulting solution was poured into methyl alcohol to reprecipitate the polymer. The thus-precipitated polymer was dried to a constant weight at 30° C. under reduced pressure. This procedure was repeated three times.

Comparative Example 3: Acrylonitrile-butadiene copolymer rubber obtained by a solution polymerization process The copolymer rubber was obtained by using the same apparatus as that used in Example 1 and conducting polymerization in accordance with the following formulation:

| | |
|---|---|
| Butadiene | 55 parts |
| Acrylonitrile | 45 parts |
| Polymerization initiator(*1) | 1 part |
| Methyl ethyl ketone | 200 parts |

(*1)2,5-Dimethyl-2,5-di(2-ethylhexanol peroxy)-hexane

The physical properties of the respective copolymer rubbers are shown in Table 1. Further, using these copolymer rubbers (g) through (i), respective adhesive solutions and insulating tapes were successively prepared in the same manner as in Example 1 to evaluate them about the same properties as in Example 1. The results are shown in Table 2.

TABLE 1

| | Rubber No. | | | | | | | | |
|---|---|---|---|---|---|---|---|---|---|
| | a | b | c | d | e | f | g | h | i |
| | Preparation process of NBR | | | | | | | | |
| | Suspension | Suspension | Suspension | Suspension | Suspension | Suspension | Nipol 1031 | Purified Nipol 1031 | Solution |
| Monomer | | | | | | | | | |
| Butadiene | 55 | 70 | 65 | 80 | | 5 | | | |
| Isoprene | | | | | 60 | | | | |
| Acrylonitrile | 45 | | 25 | 15 | 30 | 40 | | | |
| Methacrylonitrile | | 30 | | | | | | | |
| Methacrylic acid | | | 10 | | | | | | |
| Styrene | | | | 5 | | | | | |
| Butyl acrylate | | | | | 10 | | | | |
| Hydrogenated butadiene | | | | | | 55 | | | |
| Initiator | | | | | | | | | |
| 2,5-Dimethyl-2,5-di(2-ethylhexanoyl peroxy)hexane | 0.5 | | | | | | 0.5 | | 1.0 |
| t-Butyl peroxypivalate | | 0.25 | | | | | | | |
| Diisopropyl peroxydicarbonate | | | 0.25 | | | | | | |
| Acetyl peroxide | | | | 0.2 | | | | | |
| Azobisisobutyronitrile | | | | | 0.25 | | | | |
| Dispersant | | | | | | | | | |
| Partially saponified polyvinyl alcohol | 0.5 | | | | | | 0.5 | | |
| Methyl cellulose | | 1.0 | | | | | | | |
| Hydroxyethyl cellulose | | | 0.05 | | | | | | |
| Carboxymethyl cellulose | | | | 3.0 | | | | | |
| Polyacrylic acid | | | | | 0.01 | | | | |
| Ion content (ppm) | 2.5 | 3.5 | 2.0 | 4.1 | 1.9 | 2.5 | 250 | 20 | 1.7 |
| Electric conductance (μS) | 15 | 23 | 20 | 28 | 12 | 18 | 200 | 50 | 10 |
| Mooney viscosity | 74 | 52 | 65 | 31 | 41 | 95 | 65 | 80 | 10 |
| Content of nitrile-contained monomer in polymer (wt. %) | 40 | 32 | 21 | 12 | 29 | 37 | 41 | 41 | 40 |

TABLE 2

| | Example | | | | | |
|---|---|---|---|---|---|---|
| | 1 | 2 | 3 | 4 | 5 | 6 |
| Initial leakage current value (A) | $<1 \times 10^{-13}$ | $<1 \times 10^{-13}$ | $<1 \times 10^{-13}$ | $<1 \times 10^{-13}$ | $<1 \times 10^{-13}$ | $<1 \times 10^{-13}$ |
| Leakage current value after 500-hour PCT (A) | $3 \times 10^{-12} - 5 \times 10^{-12}$ | $2 \times 10^{-12} - 4 \times 10^{-12}$ | $2 \times 10^{-12} - 4 \times 10^{-12}$ | $2 \times 10^{-12} - 1 \times 10^{-12}$ | $7 \times 10^{-12} - 7 \times 10^{-12}$ | $5 \times 10^{-12} - 3 \times 10^{-12}$ |
| Adhesive strength at room temperature after taping (g) | 550 | 530 | 530 | 480 | 500 | 550 |
| Adhesive strength after heat history (g) | 530 | 540 | 510 | 480 | 510 | 550 |
| Condition of tape surface | Good | Good | Good | Good | Good | Good |
| Rubber No. | a | b | c | d | e | f |

| | Comparative Example | | |
|---|---|---|---|
| | 1 | 2 | 3 |
| Initial leakage current value (A) | $<1 \times 10^{-13}$ | $<1 \times 10^{-13}$ | $<1 \times 10^{-13}$ |
| Leakage current value after 500-hour PCT (A) | $4 \times 10^{-8} - 2 \times 10^{-7}$ | $5 \times 10^{-9} - 8 \times 10^{-8}$ | $1 \times 10^{-12} - 3 \times 10^{-10}$ |
| Adhesive strength at room temperature after taping (g) | 530 | 530 | 150 |
| Adhesive strength after heat history (g) | 530 | 520 | 100 |
| Condition of tape surface | Good | Good | Considerably sticky |
| Rubber No. | g | h | i |

Comparative Examples 4–7

Respective copolymer rubbers were obtained in accordance with the polymerization procedure described in Example 1 except that the amounts of butadiene, acrylonitrile and the polymerization initiator were changed to their corresponding amounts as shown in Table 3. The physical properties are shown in Table 3. Further, using these copolymer rubbers (j) through (m), respective adhesive solutions and insulating tapes were successively prepared in the same manner as in Example 1 to evaluate them about the same properties as in Example 1. The results are shown in Table 4.

TABLE 3

| | | Rubber No. | | | |
|---|---|---|---|---|---|
| | | j | k | l | m |
| Monomer | Butadiene | 96 | 45 | 55 | 55 |
| | Acrylonitrile | 4 | 55 | 45 | 45 |
| Amount of initiator (part) | | 0.2 | 0.7 | 0.7 | 0.4 |
| Ion content (ppm) | | 2.0 | 2.3 | 1.9 | 2.0 |
| Electric conductance (μS) | | 20 | 18 | 15 | 18 |
| Mooney viscosity | | 75 | 60 | 25 | 110 |
| Content of nitrile-contained monomer in polymer (wt. %) | | 8 | 47 | 40 | 40 |

TABLE 4

| | Comparative Example | | | |
|---|---|---|---|---|
| | 4 | 5 | 6 | 7 |
| Initial leakage current value (A) | $<1 \times 10^{-13}$ | $<1 \times 10^{-13}$ | $<1 \times 10^{-13}$ | $<1 \times 10^{-13}$ |
| Leakage current value after 500-hour PCT (A) | $3 \times 10^{-12} - 1 \times 10^{-10}$ | $5 \times 10^{-12} - 8 \times 10^{-10}$ | $5 \times 10^{-12} - 9 \times 10^{-9}$ | $5 \times 10^{-12} - 5 \times 10^{-10}$ |
| Adhesive strength at room temp. after taping (g) | 220 | 350 | 180 | 300 |
| Adhesive strength after heat history (g) | 110 | 200 | 100 | 210 |
| Condition of tape surface | Good | Unflexible | Considerably sticky | Unflexible |
| Rubber No. | j | k | l | m |

Example 7

A copolymer rubber was prepared in the same manner as in Example 1. Using the thus-obtained copolymer rubber, an adhesive solution was prepared in accordance with the following composition using an epoxy resin instead of the phenolic resin:

| Copolymer rubber | 100 parts |
|---|---|
| Epoxy resin(*1) | 200 parts |
| 4,4'-Diaminodiphenyl sulfone | 36 parts |
| Benzyldimethylamine | 2 parts |
| Benzoyl peroxide | 0.5 part |
| Methyl ethyl ketone | 500 parts |

(*1)A cresol novolak type epoxy resin.

The above-prepared adhesive solution was applied onto a polyimide film ("Capton" trade name, product of Du Pont; thickness: 50 μm) to give a dry coat thickness of 25 μm. The thus-coated film was dried for 10 minutes at 120° C. With respect to the insulating tape thus obtained, the leakage current value and adhesive strength were determined. The results are shown in Table 5.

Examples 8-12

Using copolymer rubbers obtained in the same manner as in Examples 2 through 6, respective adhesive solutions and insulating tapes were successively prepared in the same manner as in Example 7 to evaluate them about the same properties as in Example 7. The results are shown in Table 5.

Comparative Examples 8-10

Using the same copolymer rubbers as those used in Comparative Examples 1 through 3, respective adhesive solutions and insulating tapes were successively prepared in the same manner as in Example 7 to evaluate them about the same properties as in Example 7. The results are shown in Table 5.

Comparative Examples 11-14

Respective copolymer rubbers were obtained in the same manner as in Comparative Examples 4 though 7. Using these copolymer rubbers, respective adhesive solutions and insulating tapes were successively prepared in the same manner as in Example 7 to evaluate them about the same properties as in Example 7. The results are shown in Table 6.

TABLE 6

|  | Comparative Example | | | |
| --- | --- | --- | --- | --- |
|  | 11 | 12 | 13 | 14 |
| Initial leakage current value (A) | $<1 \times 10^{-13}$ | $<1 \times 10^{-13}$ | $<1 \times 10^{-13}$ | $<1 \times 10^{-13}$ |
| Leakage current value after 500-hour PCT (A) | $1 \times 10^{-12} - 5 \times 10^{-11}$ | $2 \times 10^{-12} - 4 \times 10^{-10}$ | $2 \times 10^{-12} - 5 \times 10^{-10}$ | $2 \times 10^{-12} - 3 \times 10^{-10}$ |
| Adhesive strength at room temp. after taping (g) | 215 | 360 | 190 | 320 |
| Adhesive strength after heat history (g) | 100 | 200 | 120 | 190 |
| Condition of tape surface | Good | Unflexible | Considerably sticky | Unflexible |
| Rubber No. | j | k | l | m |

We claim:
1. An adhesive composition comprising
(A) 100 parts by weight of at least one rubber component selected from the group consisting of
  (i) unsaturated nitrile-conjugated diene copolymer rubbers prepared by an aqueous suspension polymerization, containing 10-45 wt. % of unsaturated nitrile units in their polymer chains and having a Mooney viscosity ($ML_{1+4}$, 100° C.) of 30-100, and
  (ii) hydrogenated unsaturated nitrile-conjugated diene copolymer rubbers obtained by hydrogenating carbon-carbon double bonds in unsaturated nitrile-conjugated diene copolymer rubbers prepared by an aqueous suspension poly-

TABLE 5

|  | Example | | | | | |
| --- | --- | --- | --- | --- | --- | --- |
|  | 7 | 8 | 9 | 10 | 11 | 12 |
| Initial leakage current value (A) | $<1 \times 10^{-13}$ | $<1 \times 10^{-13}$ | $<1 \times 10^{-13}$ | $<1 \times 10^{-13}$ | $<1 \times 10^{-13}$ | $<1 \times 10^{-13}$ |
| Leakage current value after 500-hour PCT (A) | $4 \times 10^{-13} - 6 \times 10^{-13}$ | $1 \times 10^{-12} - 2 \times 10^{-12}$ | $1 \times 10^{-12} - 2 \times 10^{-12}$ | $8 \times 10^{-13} - 2 \times 10^{-12}$ | $5 \times 10^{-13} - 7 \times 10^{-13}$ | $5 \times 10^{-13} - 6 \times 10^{-13}$ |
| Adhesive strength at room temperature after taping (g) | 540 | 530 | 540 | 490 | 520 | 560 |
| Adhesive strength after heat history (g) | 520 | 530 | 530 | 490 | 520 | 560 |
| Condition of tape surface | Good | Good | Good | Good | Good | Good |
| Rubber No. | a | b | c | d | e | f |

|  | Comparative Example | | |
| --- | --- | --- | --- |
|  | 8 | 9 | 10 |
| Initial leakage current value (A) | $<1 \times 10^{-13}$ | $<1 \times 10^{-13}$ | $<1 \times 10^{-13}$ |
| Leakage current value after 500-hour PCT (A) | $6 \times 10^{-8} - 8 \times 10^{-8}$ | $1 \times 10^{-9} - 2 \times 10^{-9}$ | $6 \times 10^{-13} - 9 \times 10^{-11}$ |
| Adhesive strength at room temperature after taping (g) | 520 | 520 | 150 |
| Adhesive strength after heat history (g) | 510 | 510 | 120 |
| Condition of tape surface | Good | Good | Considerably sticky |
| Rubber No. | g | h | i | merization, containing 10–45 weight percent of unsaturated nitrile units in the polymer chain and having a Mooney viscosity ($ML_{1+4}$, 100° C.) of 30–100, said rubber component containing 10 ppm or less of organic and inorganic ions and having an electric conductance of 30 $\mu$S/cm as measured on an extractant solution when extracted with deionized water, and (B) 50–500 parts by weight of at least one thermosetting resin selected from the group consisting of phenolic resins and epoxy resins.

2. The adhesive composition according to claim 1, which comprises further a vulcanizing agent for the rubber component (A) and a curing agent for the thermosetting resin (B).

3. The adhesive composition according to claim 1, which comprises further an organic solvent in an amount sufficient to dissolve intimately the rubber component (A) and the thermosetting resin (B) therein.

4. The adhesive composition according to claim 1, which is an adhesive for joining electronic parts to each other or other parts.

5. An insulating tape comprising a base material and a layer of the adhesive composition according to claim 1, which has been formed on the base material.

6. The adhesive composition according to claim 1, wherein the copolymer rubber component comprises 55–90 wt. % of conjugated diene units, 10–45 wt. % of unsaturated nitrile units and 0–20 wt. % of units copolymerizabe therewith.

7. The adhesive composition according to claim 1, wherein the thermosetting resin is a novolak, resol or bisphenol A resin.

* * * * *